(12) United States Patent
Lee

(10) Patent No.: US 12,345,773 B2
(45) Date of Patent: Jul. 1, 2025

(54) SYSTEM FOR ESTIMATING THE STATE OF HEALTH (SOH) OF BATTERY, SYSTEM AND METHOD FOR DERIVING PARAMETERS THEREFOR

(71) Applicant: HEI, Busan (KR)

(72) Inventor: Eunseok Lee, Daegu (KR)

(73) Assignee: HEI, Busan (KR)

( * ) Notice: Subject to any disclaimer, the term of this patent is extended or adjusted under 35 U.S.C. 154(b) by 119 days.

(21) Appl. No.: 18/307,621

(22) Filed: Apr. 26, 2023

(65) Prior Publication Data

US 2023/0258734 A1    Aug. 17, 2023

Related U.S. Application Data

(63) Continuation-in-part of application No. PCT/KR2022/017998, filed on Nov. 15, 2022.

(30) Foreign Application Priority Data

Nov. 15, 2021 (KR) .......... 10-2021-0156405

(51) Int. Cl.
*G01R 31/392* (2019.01)
*G01R 31/367* (2019.01)
*G01R 31/3842* (2019.01)

(52) U.S. Cl.
CPC ......... *G01R 31/392* (2019.01); *G01R 31/367* (2019.01); *G01R 31/3842* (2019.01)

(58) Field of Classification Search
CPC ............... B60L 58/16; B60L 2240/545; B60L 2240/547; B60L 2240/549; B60L 58/12; B60L 3/12; B60R 16/033; G01R 31/392; G01R 31/36; G01R 31/382; G01R 31/3842; G01R 31/367; G01R 31/3648;
(Continued)

(56) References Cited

U.S. PATENT DOCUMENTS 6,311,080 B1 * 10/2001 Mochida ............ G01R 31/3835
                                                            324/427
9,121,910 B2 * 9/2015 Maluf ................... H01M 10/48
(Continued)

OTHER PUBLICATIONS

Lesnicki, Dominika & Gao, Chloe & Rotenberg, Benjamin & Limmer, David. (2020). Field-Dependent Ionic Conductivities from Generalized Fluctuation-Dissipation Relations. Physical Review Letters. 124. 10.1103/PhysRevLett.124.206001. (Year: 2020).*
(Continued)

*Primary Examiner* — Daniel R Miller
*Assistant Examiner* — Eric Sebastian Von Wald
(74) *Attorney, Agent, or Firm* — United One Law Group LLC; Kongsik Kim; Jhongwoo Peck

(57) ABSTRACT

Systems and methods for estimating the state of health (SOH) of a battery are provided. The system includes a database, a parameter processing module, and an SOH estimation module. The database stores current and voltage data measured at a specific sampling rate during battery charging. The parameter processing module obtains response functions in the frequency domain, differential capacity, and differential voltage based on the stored current and voltage data and uses them to obtain parameters for SOH estimation. The SOH estimation module uses some or all the obtained parameters to estimate the SOH.

14 Claims, 13 Drawing Sheets

(58) Field of Classification Search
CPC .............. G01R 19/12; G01R 19/16528; G01R 19/16542; G01R 23/06; G01R 31/385; G01R 19/10; H01M 10/48; H02J 7/0048; H02J 7/005; H02J 7/00041; Y02T 10/70
See application file for complete search history.

(56) References Cited

U.S. PATENT DOCUMENTS

| | | | |
|---|---|---|---|
| 10,451,684 B2 * | 10/2019 | Murase | H01M 50/204 |
| 2014/0239965 A1 * | 8/2014 | Calderon | G01R 31/396 |
| | | | 324/433 |
| 2019/0120910 A1 * | 4/2019 | Ghantous | G01R 31/392 |
| 2020/0266500 A1 * | 8/2020 | Hinterberger | H01M 10/486 |
| 2021/0336462 A1 * | 10/2021 | Wang | H02J 7/0048 |
| 2023/0266399 A1 * | 8/2023 | Ishii | H01M 10/42 |
| | | | 702/63 |

OTHER PUBLICATIONS

Li, Jiajun. (2020). Non-equilibrium Effects in Dissipative Strongly Correlated Systems. 10.48550/arXiv.2009.12865. (Year: 2020).*

* cited by examiner (a)

(b)

SYSTEM FOR ESTIMATING THE STATE OF HEALTH (SOH) OF BATTERY, SYSTEM AND METHOD FOR DERIVING PARAMETERS THEREFOR

CROSS REFERENCE TO RELATED APPLICATIONS

The present application is a Continuation-in-part of International Application No. PCT/KR2022/017998, filed on Nov. 15, 2022, which claims priority from Korean Application No. 10-2021-0156405, filed on Nov. 15, 2021. The aforementioned applications are incorporated herein by reference in their entireties.

TECHNICAL FIELD

The present disclosure relates to a system for estimating the state of health (SOH) of a battery, more specifically to a system and method that can obtain a response function of the battery based on current and voltage fluctuations measured during battery charging, derive SOH parameters based on the obtained response function, the rate of change in capacity with respect to voltage, and the rate of change in voltage with respect to capacity, and estimate the SOH based on tracking of the changes in the SOH parameters with accumulated charge capacity.

RELATED ART

Rechargeable batteries (hereinafter also referred to as "batteries") are used in a variety of applications, including small electronic devices, such as smart phones, laptop computers and personal digital assistant (PDA), and large-size electric systems, such as electric vehicles and energy storage systems.

Batteries usually deteriorate over time and usage, and as a result, experience performance degradation, such as a decrease in power and capacity, which leads to a degradation of battery performance and failure of applications that operate on the batteries.

The state of health (SOH) of a battery is an indicator that shows how much the battery retains with respect to its initial performance. Since it can be used to determine whether the battery should be replaced, it is important to obtain the SOH accurately for reliable operations of applications.

The SOH is usually estimated by measuring battery parameters, such as maximum capacity, current, voltage, internal resistance and impedance, heat generation rate, peak points in differential capacity curve, and comparing them with their reference values. There are a variety of methods that use different parameters, methods of obtaining them, and methods of integrating and analyzing them. Many efforts are being made to improve existing methods and develop new ones.

SUMMARY

The present disclosure provides new systems and methods for obtaining parameters (e.g., SOH parameters) for SOH estimation and for estimating the SOH based on the SOH parameters. More specifically, current and voltage may be measured during charging, and the generalized fluctuation-dissipation theorem may be applied to the measured current and voltage to obtain the SOH parameters. For each battery model, an SOH model may be developed as a function of SOH parameters and accumulated charge capacity by training based on reference data. The developed SOH model may then be used to estimate and predict the current SOH as well as a future SOH. The results of estimation and prediction may be fed back to the SOH model for iterative improvement and calibration of the model.

An aspect of the present disclosure provides a system that may obtain SOH parameters based on a response function of a battery in the frequency domain, which is obtained from current and voltage fluctuations measured during battery charging, as well as differential capacity and differential voltage curves. This system may also estimate the SOH by tracking changes in the obtained SOH parameters with respect to accumulated charge capacity.

In some embodiments, the system according to the present disclosure may include a database, a parameter processing module, and an SOH estimation module. The database may store current and voltage measurement taken at a specific sampling rate during battery charging, the parameter processing module may obtain a response function of the battery, a differential capacity, and a differential voltage derived from the stored current and voltage data and may derive SOH parameters, and the SOH estimation module may estimate the SOH based on the SOH parameters.

The following features may be included individually or in any combination.

The parameter processing module may obtain the response function of the battery in the frequency domain, based on the Generalized Fluctuation-Dissipation Theorem (GFDT), for each predetermined state of charge (SOC) segment.

The parameter processing module may include a calculation unit, which includes a fluctuation part, an autocorrelation function part, and a response function part. The fluctuation part may obtain, from the database, current fluctuation $\Delta I(t)$ during constant current charging (mode I, hereafter), which are defined as the difference of current $(I(t))$ from the nominal current $(I_0(t))$, and voltage fluctuation $\Delta V(t)$ during constant voltage charging (mode II, hereafter), which are defined as the difference of voltage $(V(t))$ from the nominal voltage $(V_0(t))$. The autocorrelation function part may obtain autocorrelation functions for current and voltage fluctuations $(C_I(t)$ and $C_V(t)$, respectively). The response function part may obtain segmental response functions in the time domain $(X(t)$ and $Y(t))$ using the following equations, which are then converted to the frequency domain $(X'(\omega)$ and $Y'(\omega))$ via the Fourier transform:

$$X(t) = \begin{cases} C_I(t)/(k_B T), & t \geq 0 \\ 0, & t < 0 \end{cases}, Y(t) = \begin{cases} C_V(t)/(k_B T), & t \geq 0 \\ 0, & t < 0 \end{cases}$$

where $X(t)$ and $Y(t)$ are the segmental response functions based on the current and voltage fluctuations, respectively, $k_B$ is the Boltzmann constant, and T is a temperature.

For each SOC segment, in some embodiments, the autocorrelation function part may divide the data series of the current and voltage fluctuations into a plurality of groups, each having the same sampling rate as the original but having a shorter duration, may obtain the autocorrelation functions for each of the plurality of groups, and may use their average to obtain the (representative) autocorrelation functions for that SOC segment.

For each SOC segment, in some embodiments, the auto-correlation function part may divide the data series of the current and voltage fluctuations into a plurality of groups, each having the same duration as the original but having a lower sampling rate, may obtain the autocorrelation functions for each of the plurality of groups, and may use their average to obtain the (representative) autocorrelation functions for that SOC segment.

The response function part may obtain response functions in the frequency domain X'($\omega$) and Y'($\omega$) for each SOC segment (d) and accumulated charge capacity (z) and, thus, eventually as X'($\omega$, d, z) and Y'($\omega$, d, z). The parameter processing module may include another calculation unit that obtains the rate of change in capacity with respect to the voltage (differential capacity; dQ/dV) during constant current charging and the rate of change in voltage with respect to the capacity (differential voltage; dV/dQ) during constant voltage charging. dQ/dV and dV/dQ may also be obtained per z and stored in the database to be used as additional SOH parameters. If the resolution of measurement is insufficient to distinguish the voltage fluctuations, dV/dQ may appear to be zero. In this case, the SOH parameters that rely on dV/dQ will be assigned a zero weight as the SOH modeling proceeds.

The SOH estimation module may track changes in the SOH parameters with respect to the accumulated charge capacity to estimate the SOH.

The parameter processing module may calculate X'($\omega$, d, z)/X'($\omega$, d, $z_0$) and Y'($\omega$, d, z)/Y'($\omega$, d, $z_0$), where $z_0$ indicates an initial charge capacity, the standard deviation of these ratios across w at each d and z, the similarity of dV/dQ curve between the present and previous charging, and the similarity of dQ/dV curve between the present and previous charging.

The SOH estimation module may apply weights for the SOH parameters, which are stored in and read from the database to the corresponding SOH parameters and may calculate their sum, $\theta(\tilde{z})$, where $\tilde{z}$ is an accumulated charge capacity at the end of each charging session. The sum $\theta(\tilde{z})$ itself or its ratio to $\theta(\tilde{z}_0)$ may be used as an indicator for the SOH.

The database may also store the weights of the SOH parameters for each battery model. For each battery model, several sample batteries may be prepared to generate reference data. These batteries may be repeatedly charged and discharged while the SOH parameters are obtained as a function d and z. The SOH may also be obtained as a function of z ($SOH^{ref}(z)$) by comparing a selected characteristic property, such as full charge capacity, charge capacity within a specific SOC range, internal resistance, etc., to its initial value. While charge capacity within a specific SOC range is used as the characteristic property in the examples provided hereafter, the present disclosure is not limited thereto, and other characteristic properties may also be used.

For each sample battery, the weights of the SOH parameters may be adjusted so that the resultant sum $\theta(z)$ of the weighted parameters matches to a reference SOH ($SOH^{ref}(z)$) for a variety of z. The collection of these adjusted weights may be referred to as an SOH model of the sample battery.

The SOH parameters may be stored in the database and classified by the battery model. The system may further include a reference management module. For each battery model, the reference management module may compare the SOH model across the sample batteries and may examine for anomalies. The SOH models with anomalies may be excluded and the remaining ones may be averaged towards the representative SOH model of that specific battery model. The excluded abnormal SOH models may also be stored in the database in case they later turn out to be other or new battery models.

The estimated SOHs may be stored in the database and classified by the battery model. The system may also include an analysis module, which compares the SOH of a battery with the SOH distribution of other batteries within the same battery model and evaluates that battery. The analysis module may determine that a battery is normal in response to its SOH being within a pre-defined range around the mean SOH of other batteries within the same battery model.

In response to a battery's SOH being outside of the pre-defined normal range, the analysis module may perform further analysis by comparing the values of the battery's SOH parameters with those of other batteries within the same model. In response to an outlier SOH parameter being detected, the analysis module may determine that the battery is not normal.

The SOH estimation module may track changes in the SOH parameters with respect to z, and may predict future behaviors in the SOH parameters and the resultant SOH at future values of z. The analysis module may perform the same analysis for the predicted future SOH as it does for the estimated current SOH. The system may include a notification module, which sends the estimated and predicted SOHs and the analysis result to, for example, users.

The parameter processing module may include a first calculation unit, a second calculation unit, and a post-processing unit. The first calculation unit may obtain the response functions in the frequency domain X'($\omega$) and Y'($\omega$) from the current and voltage measurements. The second calculation unit may obtain the differential capacity dQ/dV and the differential voltage dV/dQ. The post-processing unit may obtain the SOH parameters based on all of the results from the first and second calculation units.

The first calculation unit may obtain X'($\omega$) and Y'($\omega$) for each SOC segment, based on the generalized fluctuation-dissipation theorem (GFDT).

The post-processing unit may obtain the SOH parameters based on the ratios of X'($\omega$) and Y'($\omega$) to their initial values at each frequency, the standard deviation of these ratios, and the similarity of the dQ/dV (and dV/dQ) curves between present and previous charging.

In an aspect of the present disclosure, a method, which the parameter processing module of the system may be configured to perform, may include retrieving the measured current and voltage data from the database, obtaining X'($\omega$) and Y'($\omega$) based on the current and voltage data, obtaining differential capacity and differential voltage from the current and voltage data, and obtaining SOH parameters based on the response functions in the frequency domain, the differential capacity, and the differential voltage.

The system according to the present disclosure may obtain a response function of a battery in the frequency domain based on GFDT and may also obtain SOH parameters based on the response function. In particular, the SOH parameters across all frequencies may be retrieved from one continuous measurement of current and voltage during battery charging. Thus, it is not necessary to repeat a process of applying input and measuring output per frequency nor to use additional equipment for such a process, which are usually required for other frequency domain methods, such as electrical impedance spectroscopy.

Also, it is not necessary to narrow the frequency range and identify the frequencies of importance for the frequency range. The system can monitor parameters across the full spectrum of frequency, thereby minimizing the risk of missing important parameters that may emerge later due to chemical changes caused by battery aging.

In practice, the frequency range that can be analyzed may be limited due to discrete measurement of current and voltage. However, such limit can be controlled by adjusting the sampling rate and measurement duration. This adjustment may also be used to selectively remove unnecessary electrical noises in either high or low frequency range, for a more reliable SOH estimation.

In the system, according to the present disclosure, the SOH models may be developed based on changes in the SOH parameters as z varies, and thus the reliability of an SOH model may be improved as more charging data are collected. The system may also collect SOH models and produce a representative SOH model for each battery model, and the reliability of the representative SOH model may be improved as the number of SOH models increases. Thus, the system may predict and control the reliability of representative SOH models and resultant SOH estimation. Also, the SOH and SOH parameters of a battery may be compared with those of other batteries within the same battery model, and the result may be provided to users by the notification module.

The benefits of the present disclosure are not limited to those described above and may be understood throughout this specification.

DETAILED DESCRIPTION

Figure 1:
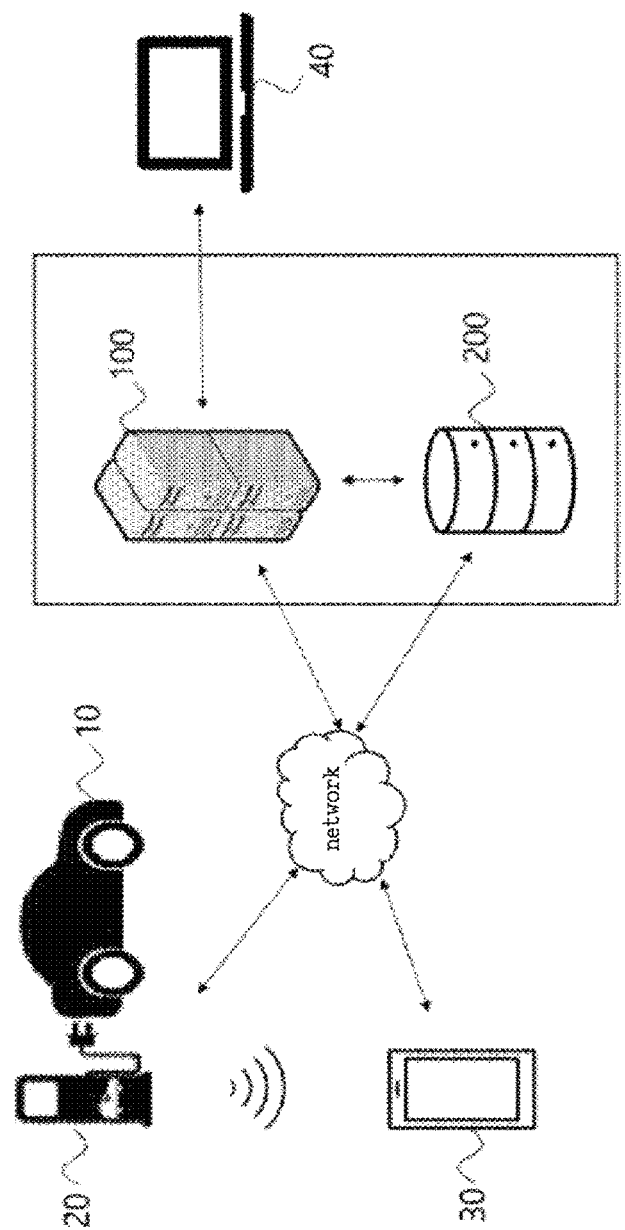
FIG. 1 schematically shows an embodiment of a system for battery SOH estimation, as well as other relevant elements, according to embodiments of the present disclosure.

The advantages and features of the present disclosure, and methods of achieving them, will become apparent upon reference to the embodiments described in detail with reference to the accompanying drawings. However, the disclosure is not limited to the embodiments disclosed herein. The present disclosure can be embodied in many different forms, and these embodiments are provided merely to make the disclosure complete and to fully inform one of ordinary skill in the art to which the disclosure belongs, and the disclosure is defined by the scope of the claims.

The dimensions and relative sizes of the components shown in the drawings may be varied for clarity of description. Throughout the specification, like reference numerals refer to like components, and "and/or" includes each and every combination of one or more of the items mentioned.

The terminology used in this specification is intended to describe embodiments and is not intended to limit the disclosure. As used herein, singular forms also include plural forms unless the context clearly requires otherwise. The words "comprises" and/or "comprising" as used in the specification do not exclude the presence or addition of one or more other components in addition to those mentioned.

Although the terms "first," "second," and the like are used to describe various devices or components, such devices or components are not limited by such terms. These terms are used merely to distinguish one element or component from another, so that a first element or component referred to herein may also be a second element or component within the technical idea of the present disclosure.

Unless otherwise defined, all terms (including technical and scientific terms) used in this specification are intended to be used in the sense in which they would be understood by one of ordinary skill in the technical field to which the present disclosure belongs, and commonly used dictionary definitions are not to be construed as idealized or over-interpreted unless expressly defined as such.

The following detailed description is not intended to be limiting, and the scope of the disclosure is limited only by the appended claims, which, when properly described, encompass all the equivalents of what is claimed therein. In the drawings, like reference numerals refer to the same or similar features in various aspects.

Hereinafter, the disclosure will be presented in detail with reference to embodiments and drawings, which are intended to help readers to better understand the disclosure, not to limit the scope thereof. The disclosure may be embodied in various forms.

According to the present disclosure, various state of health (SOH) parameters may be obtained, and the SOH of batteries may be estimated based on the obtained SOH parameters. The following embodiments explain SOH estimation for electric vehicle (EV) batteries; however, application of the present disclosure is not limited to EV batteries, and it may be applied to any batteries for other devices and systems.

A battery may typically comprise a cathode, an anode, one or more separators, electrolyte, SEI layer, contacts, etc., and these components, especially their material properties and integration, deteriorate over time and during charging-discharging cycles, which may result in the degradation of performance and safety.

In a battery, the dynamic characteristics of charge carriers such as ions and electrons are largely dependent on the surrounding chemical environment. As the battery materials and their integration deteriorate, the chemical environment surrounding the charge carriers changes, causing a change in the dynamic characteristics of the charge carriers and consequently causing changes in a response function of the battery in response to the externally applied electrical current or voltage. Accordingly, the level of deterioration of the battery materials and their integration may be estimated by measuring the change in the response function of the battery.

According to the present disclosure, such parameters that can capture changes in the response function of a battery may be obtained, and the SOH of the battery may be evaluated based on the SOH parameters. In addition, other parameters relevant to differential capacity and differential voltage may also be obtained and employed as additional SOH parameters.

One of the well-known methods for obtaining the electrical response function of a battery is Electrical Impedance Spectroscopy (EIS); however, it requires consumption of relatively large amounts of energy and time.

More specifically, to perform the EIS, an input (electrical) signal is applied to a system of interest at a specific frequency, and the corresponding output signal is measured. Then the ratio of the output signal to the input signal is defined as the response at that specific frequency, and the response function is obtained by collecting the responses while varying the frequency. As such, a process of input application and output measurement is needed and should be repeated for every frequency of interest.

In particular, for an EV battery, the frequency of interest spans over several orders of magnitude, typically from 10 mHz to 1 kHz. Repeating the process of applying an AC input and measuring an AC output may cost a substantial amount of time and electric energy. One way to reduce the cost is to decrease the number of frequencies of interest by finding the important frequencies that correspond to the most dominant dynamic characteristics of charge carriers. However, this may cause a problem if the purpose of the EIS is to capture the change in the dynamic characteristics of charge carriers, because such important frequencies may be changed as the most dominant dynamic characteristics of charge carriers change later due to the change of surrounding chemical environment. In addition, the EIS requires a separate process and a device or equipment for carrying out the EIS.

The present disclosure provides a more efficient way to obtain a response function of a battery based on current and voltage during charging, which are measured by default for metering the amount of charged energy, controlling the charging process, monitoring, and detecting battery problems such as overvoltage and overcurrent. As such, unlike the EIS method, there is no additional and repetitive process for data collection.

In the present disclosure, a response function of a battery may be obtained by employing the generalized fluctuation-dissipation theorem (GFDT), and its components may be used in the frequency domain as primary parameters for the SOH estimation. The fluctuation-dissipation theorem (FDT) is a theory for predicting the behavior of a system. For a system under an equilibrium state, the FDT states that a response of the system to an external perturbation can be estimated by thermodynamic fluctuations in physical variables. The GFDT provides that the FDT can be applied to a system in a more generalized non-equilibrium state, especially when a system is in steady state, by additionally considering entropic terms.

The present disclosure leverages the fact that batteries are commonly charged in non-equilibrium steady states, which satisfies the necessary conditions for applying the GFDT. It employs the GFDT to obtain a response function of a battery, based on current and voltage measurements taken during the charging. This response function is subsequently used to derive parameters related to the SOH of the battery. The following embodiments provide details of systems and methods for obtaining the response function of a battery, deriving SOH parameters from the response function, and estimating the SOH based on the SOH parameters in combination with other parameters based on differential quantities.

Figure 2:
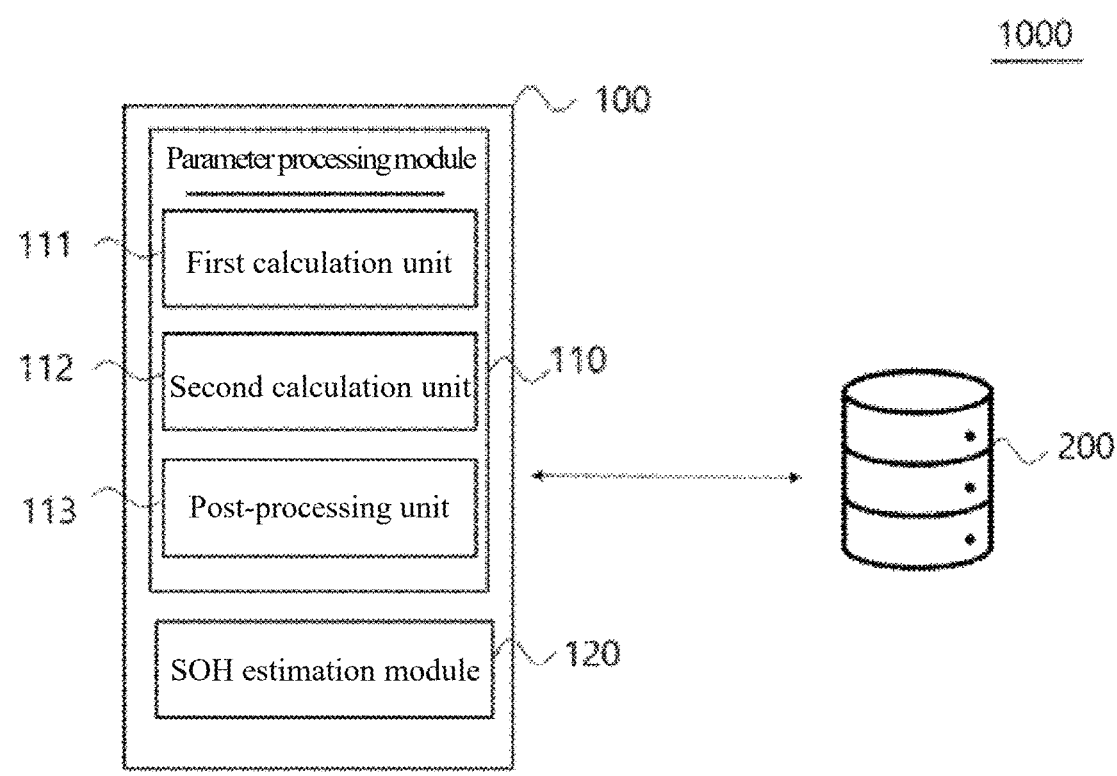
FIG. 2 is a block diagram that shows the structure of the system in more detail.
Figure 3:
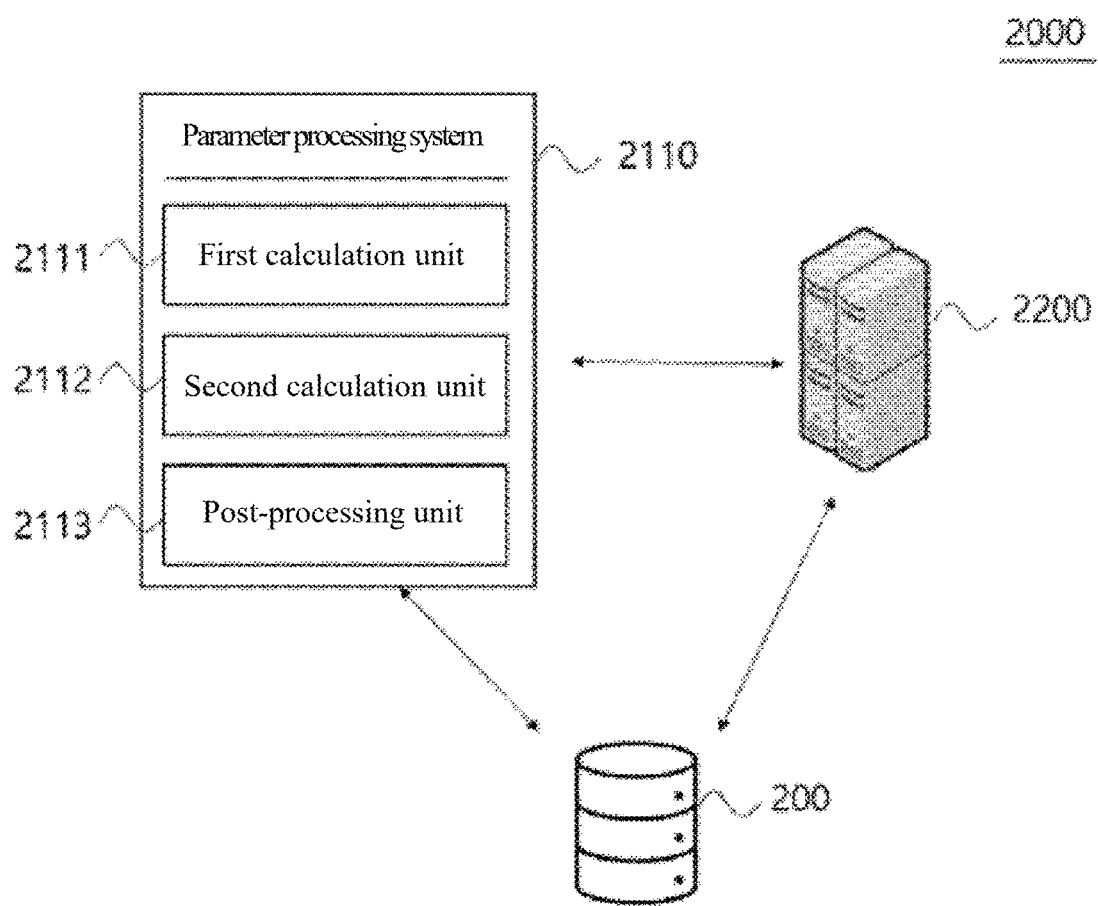
FIG. 3 is a block diagram that shows the structure of another embodiment of the system.

FIG. 1 shows an embodiment of the system for battery SOH estimation (enclosed by a rectangle) and other relevant elements. FIG. 2 is a block diagram that shows the structure of the system shown in FIG. 1 in more detail. FIG. 3 is a block diagram that shows the structure of another embodiment of the system.

Referring to FIG. 1, the system according to an embodiment of the present disclosure may include a server computer 100 and a database 200. The server computer 100 may include a parameter processing module 110 and an SOH estimation module 120 as shown in FIG. 2 or it may include a parameter processing system 2110 and an SOH estimation system 2200 as shown in FIG. 3.

The parameter processing module 110 and the SOH estimation module 120 in FIG. 2 may have equivalent functions and structures to the parameter processing system 2110 and the SOH estimation system 2200 in FIG. 3. Thus, hereinbelow, explanations will be given based on the structure shown in FIG. 2 in conjunction with the method shown in FIG. 12.

As seen in FIG. 2, the system 1000 may include a server computer 100 and a database 200. The server computer 100 may be equipped with the parameter processing module 110 and the SOH estimation module 120. The parameter processing module 110 may include two calculation units, namely, a first calculation unit 111 and a second calculation unit 112, and a post-processing 113 unit.

During the charging of an EV 10, electric current and voltage may be measured with a charger 20, the EV 10, or a separate metering device. The system in the embodiment may receive the measured data from either user's smartphone 30 or a charging service provider.

Where the user's smartphone 30 is used, the smartphone 30 may receive the current and voltage data measured by the charger 20, the EV 10, or the metering device, and may transmit the received data to the server computer 100.

Figure 12:
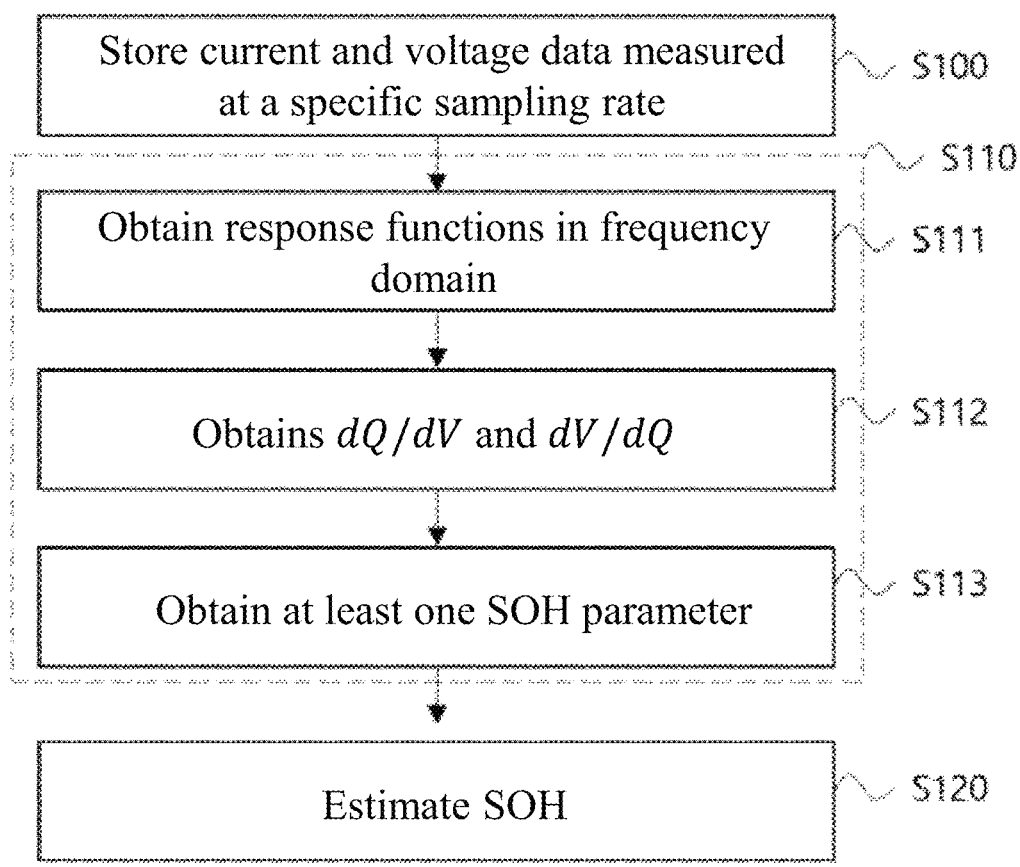
FIG. 12 is a flow diagram that explains the procedure for SOH estimation according to the embodiment shown in FIG. 2 and FIG. 3.

The database 200 of the system, which is operatively connected to the server computer 100, may store the current and voltage data measured at a specific sampling rate (S100; see FIG. 12). In some embodiments, the database 200 may be implemented as a cloud server, which is physically separated from the server computer 100 but still connected online.

The user's smartphone 30 may collect information about the user and the EV (e.g., vehicle model, battery model, or the like) and transmit it to the database 200 where the information is stored. This information may be used to match the current and voltage data measured during the charging with the corresponding battery so that the data can be tracked on a per-battery basis.

The parameter processing module 110, which is a part of the system 100, may obtain SOH parameters (S110) based on the received current and voltage data. Step S110 may also be a method for deriving the parameter adopted by the parameter processing system 2110.

The first calculation unit 111 may obtain response functions in the frequency domain using the current and voltage data stored in the database 200 for each state of charge (SOC) segment (S111).

Figure 4:
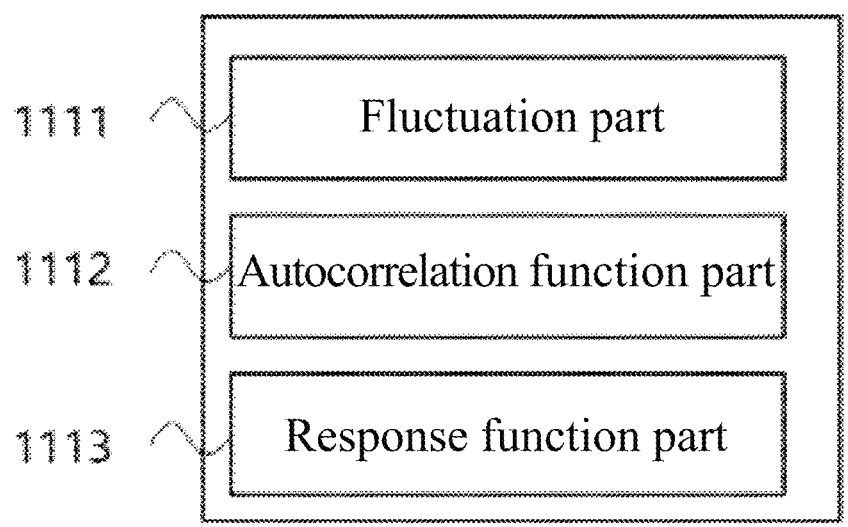
FIG. 4 is a block diagram that shows the structure of the first calculation unit shown in FIG. 2 and FIG. 3.

FIG. 4 is a diagram that shows the structure of the first calculation unit 111 in FIG. 2 and the first calculation unit 2111 in FIG. 3. More specifically, the first calculation unit 111 may include three calculation parts, namely, a fluctuation part 1111, an autocorrelation function part 1112, and a response function part 1113, respectively.

The fluctuation part 1111 may include two operating modes, for obtaining current fluctuation during constant current charging (mode I), which is defined as the deviation of current ($I(t)$) from nominal current ($I_0(t)$), and for obtaining voltage fluctuation during constant voltage charging (mode II), which is defined as the deviation of voltage (V(t)) from nominal voltage ($V_0(t)$), respectively. Accordingly, current fluctuations $\Delta I(t)=I(t)-I_0(t)$ may be obtained in mode I, and voltage fluctuations $\Delta V(t)=V(t)-V_0(t)$ may be obtained in mode II.

In general, EV batteries are charged with constant current (CC) up to about 80% SOC and with constant voltage (CV) beyond about 80% SOC.

In this embodiment, the response function of a battery may be obtained differently depending on whether the battery is being charged in CC or CV mode. Thus, the fluctuation part 1111 may operate in mode I for CC charging and mode II for CV charging.

The autocorrelation function part 1112 may obtain autocorrelation functions for current fluctuations ($C_I(t)$) and voltage fluctuations ($C_V(t)$). Here, the autocorrelation function part 1112 may apply the following noise reduction techniques based on the frequency range corresponding to important characteristics of batteries.

Figure 5:
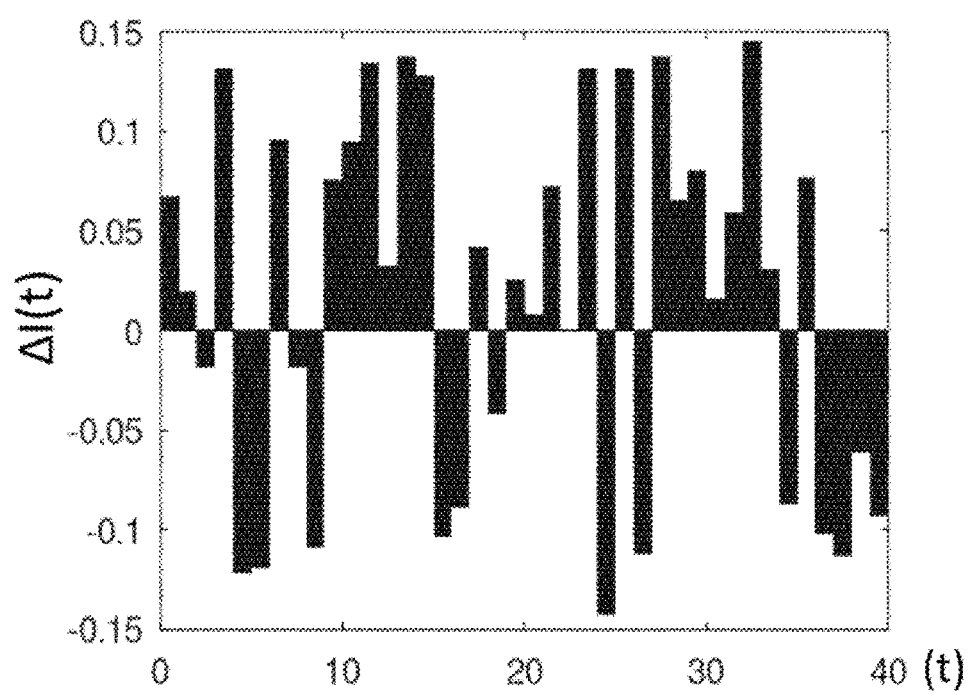
FIGS. 5-7 show graphs that explain two noise reduction techniques that may be employed by the autocorrelation function part.
Figure 6:
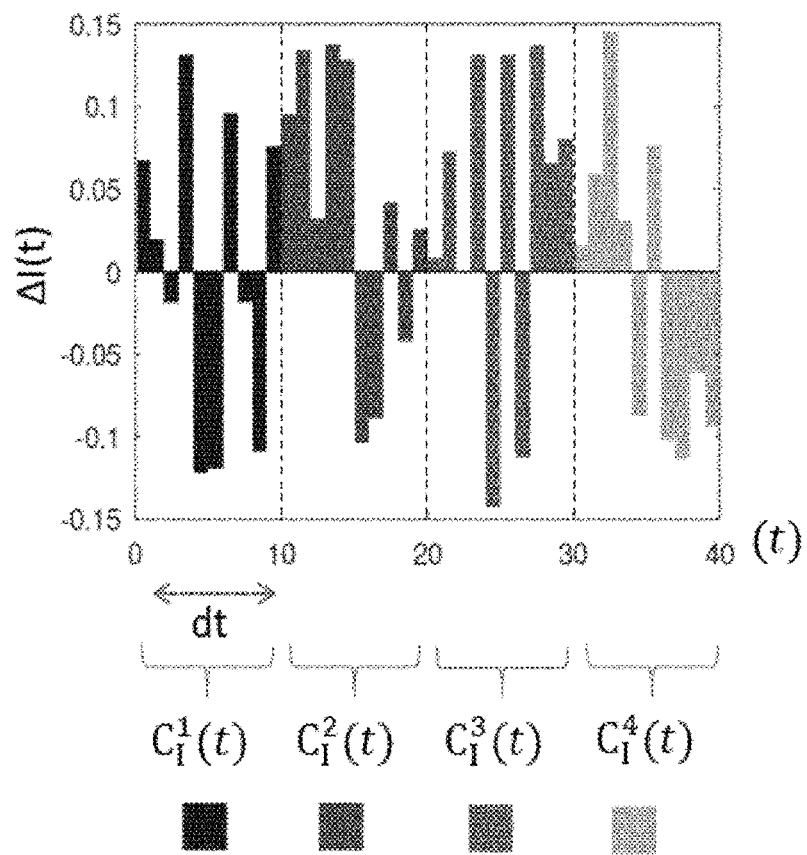
Figure 7:
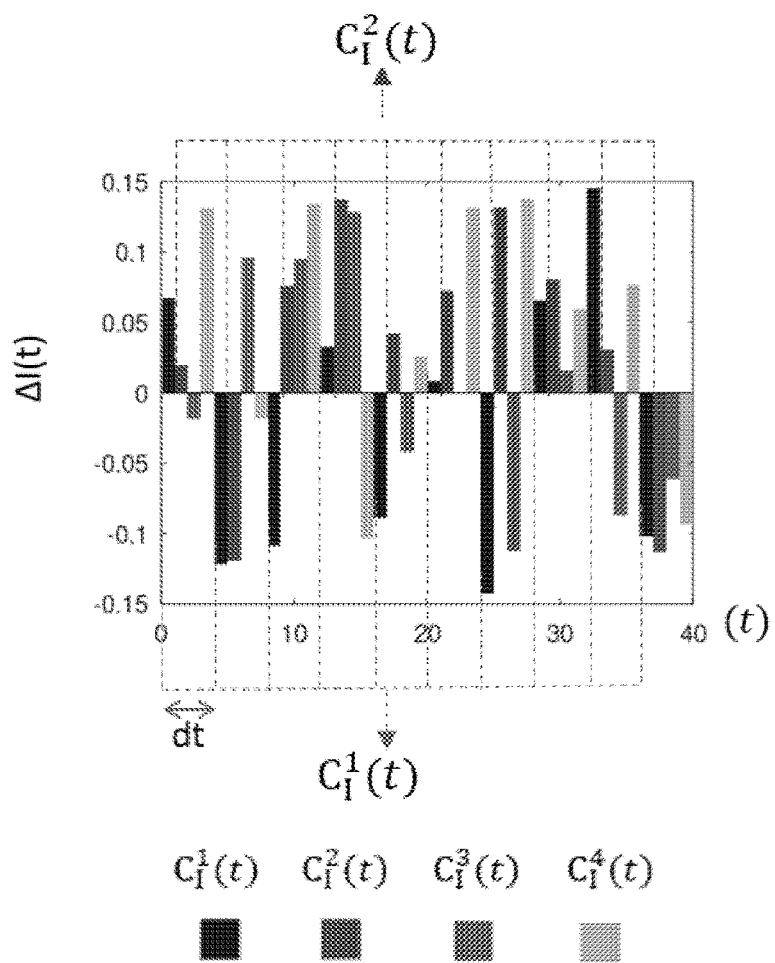

FIGS. 5-7 explain two noise reduction techniques that may be employed in the autocorrelation function part 1112 for current fluctuations $\Delta I(t)$. Substantially same techniques may be applied to voltage fluctuations $\Delta V(t)$. FIG. 5 is an example of current fluctuations $\Delta I(t)$ calculated by the fluctuation part 1111, while FIG. 6 and FIG. 7 demonstrate the first and the second noise reduction techniques, respectively, applied to the current fluctuations in FIG. 5.

In the first noise reduction technique (FIG. 6), the data series of current fluctuations $\Delta I(t)$ in an SOC segment may be divided into shorter (e.g., smaller) pieces by dividing the data series in sequence by a specific length (e.g. 4 pieces, each with the length of 10 in FIG. 6), and the autocorrelation function may be calculated for each piece ($C_I^1(t)$, $C_I^2(t)$, $C_I^3(t)$, and $C_I^4(t)$). All of the resultant autocorrelation functions may be averaged to obtain the autocorrelation function for the SOC segment ($C_I(t)=(C_I^1(t)+C_I^2(t)+C_I^3(t)+C_I^4(t))/4$).

In the second noise reduction technique (FIG. 7), the data series of current fluctuations ($\Delta I(t)$) in an SOC segment may be divided into shorter pieces of a predetermined length (e.g., 4 pieces, each with the length of 10 in FIG. 7). These pieces may be constructed by re-sampling the data series at the rate of the number of pieces while varying the initial sampling point of each piece. Then, the autocorrelation function may be calculated for each piece ($C_I^1(t)$, $C_I^2(t)$, $C_I^3(t)$, and $C_I^4(t)$ in FIG. 7). In the case of FIG. 7, the $C_I^1(t)$ may be the autocorrelation function calculated for the data series sampled at t=0, t=4, . . . , t=36, the $C_I^2(t)$ may be the autocorrelation function calculated for the data series sampled at t=1, t=5, . . . , t=37, and so on. All of the resultant autocorrelation functions may be averaged to obtain the autocorrelation function for the SOC segment ($C_I(t)=(C_I^1(t)+C_I^2(t)+C_I^3(t)+C_I^4(t))/4$ in FIG. 7).

For a more detailed example, let us assume a data series of fluctuations $\Delta I(t)$ and $\Delta V(t)$ with time step dt and 1000*dt duration in an SOC segment and assume that we desire to divide SOC segment into 10 pieces. In case of the first noise reduction technique, the first piece may include the data sampled at t=0, 1*dt, . . . , 99*dt, the second piece may include the data sampled at t=100*dt, 101*dt, . . . , 199*dt, and so on. In case of the second noise reduction technique, the first piece may include the data sampled at t=0, 10*dt, 20*dt, . . . , 990*dt, the second piece may include the data sampled at t=1*dt, 11*dt, 21*dt, . . . , 991*dt, the third piece may include the data sampled at t=2*dt, 12*dt, 22*dt, . . . , 992*dt and so on. That is, each piece may be composed of 100 data points in either technique.

When the first noise reduction technique is applied, the resultant autocorrelation function may retain the same time step as the original data series, but covers a shorter duration, thereby preserving the information in a high frequency range. When the second noise reduction technique is applied, the resultant autocorrelation function may cover the same duration as the original data series, but with a longer time step, thereby preserving the information in a low frequency range. Thus, the frequency range of interest, over which the characteristics of batteries is the most dominant, should be considered to decide whether these noise reduction techniques will be applied and, if applied, which one will be.

When batteries are being charged, the charger measures current and voltage at a specific sampling rate to ensure that they are controlled and maintained at the intended values. These data can be transmitted to the database for use by the system of the present disclosure. Additionally or alternatively, the present disclosure may also use a metering device as another channel to obtain the current and voltage. The metering device may have a sampling rate that is equal to or faster than the sampling rate of the charger.

The time step, dt, may be determined considering several factors. Certain battery characteristics may appear more prominently at specific frequencies, which can cause inefficiencies in data storage, management, and transmission if the sampling rate is set too high across the entire charging process. For example, if one parameter requires data to be sampled at a 0.1 second interval and another parameter can be adequately captured at a 10 second interval, it would be inefficient to maintain a high sampling rate (e.g., 0.1 second interval) throughout the entire charging process. The present disclosure provides varying the sampling rate flexibly. In the case of the example above, the time interval may be maintained at 0.1 seconds for a specific duration and then reset to 10 seconds for the remaining period of measurement once sufficient information has been gathered. The timing for resetting the sampling rate should be determined through a pre-examination.

According to the FDT and GFDT, for a system in equilibrium, a response function of a system to external perturbations is proportional to the correlation function between the fluctuations in relevant physical variables, observed without the perturbations. For a system in a non-equilibrium state, a correction term may be added to the response function.

The autocorrelation function part 1112 may obtain autocorrelation functions $C_I(t)=\langle\Delta I(t); \Delta I(t)\rangle$ and $C_V(t)=\langle\Delta V(t); \Delta V(t)\rangle$ for current and voltage fluctuations, respectively.

The response function part 1113 may obtain response functions X(t) and Y(t) using the following Eq. 1 and may further apply the Fourier Transform to obtain response functions in the frequency domain (X'(ω) and Y'(ω)).

$$X(t) = \begin{cases} C_I(t)/(k_B T), & t \geq 0 \\ 0, & t < 0 \end{cases}, Y(t) = \begin{cases} C_V(t)/(k_B T), & t \geq 0 \\ 0, & t < 0 \end{cases} \quad \text{Eq. 1}$$

where X(t) and Y(t) are response functions based on current and voltage fluctuations ($\Delta I(t)$ and $\Delta V(t)$), respectively. $k_B$ is the Boltzmann constant, and T is the internal temperature of battery.

With respect to the battery temperature, the present disclosure considers that battery charging typically begins when the corresponding EV arrives at the charging station, and the battery usage gradually decreases as the EV approaches the charging station. Reference data may be collected at different charging speeds to account for changes in SOH parameters that may occur due to corresponding differences in heat generation.

In addition, the present disclosure is based on utilizing the ratios of SOH parameters at present to their initial values, not the absolute values of the response functions. Thus, the impact of temperature is not explicitly addressed in the present disclosure.

However, the parameters at zero frequency may correspond to the responses related to a DC current and DC voltage and thus may be deemed to change proportionally or inverse proportionally to internal resistance. Based on this idea, the impact of temperature may be included in the SOH modeling indirectly. More specifically, internal resistance may be measured for a battery in an early fresh stage by varying the temperature and then its temperature coefficient of resistance may be pre-determined by using the relationship, $R=R_0(1+\alpha(T-T_0))$, where T is the temperature, $T_0$ is the reference temperature, R is the internal resistance, $R_0$ is the internal resistance at the reference temperature, and $\alpha$ is the temperature coefficient of resistance.

Then, assuming that the chance for significant variation of the internal resistance between two adjacent charging events is low except due to the temperature, the temperature of battery may be estimated based on the change in the parameter at zero frequency and be reflected on the process to obtain the response functions.

As a battery is being charged, the chemical environment around charge carriers may change, causing the battery's response functions to vary. Thus, when comparing response functions, it may be necessary to consider the SOC and compare only those obtained at a similar SOC.

For that purpose, the maximum capacity of a battery may be divided into even-sized SOC segments (e.g., at 10% SOC increment). When a battery is being charged, the SOC segments corresponding the measured current and voltage may be identified, and $X'(\omega)$ and $Y'(\omega)$ may be obtained for each SOC segment. The size of SOC segment may be determined considering the statistics about EV drivers' charging habits and the data sampling capability of measurement devices (i.e., chargers or metering devices).

Also, the accumulated charge capacity at the end of each SOC segment may be calculated and may serve as a variable of the response functions in the frequency domain, such as $X'(\omega, d, z)$ and $Y'(\omega, d, z)$, where d is the index of SOC segment and z is the accumulated charge capacity.

In the present disclosure, the accumulated charge capacity may be defined in two different ways: at the end of each SOC segment (z) or at the end of each charging event (ž). For example, if the accumulated charge capacity was 100 kWh in the previous charging and 47 kWh was charged in the present charging, the ž becomes 147 kWh.

Further, the response functions for the SOC segments, e.g. in case of 10% increment, 0-10% (d=1), 10-20% (d=2), 20-30% (d=3), and 30-40% (d=4) will have at z=110, 120, 130, and 140, respectively, and the one for 40-50% (d=5) SOC segment will have z=147.

In the present disclosure, both definitions of accumulated charge capacity may be used. Specifically, the response functions in the frequency domain may be obtained per an SOC segment and z ($X'(\omega, d, z)$ and $Y'(\omega, d, z)$), stored in the database 200, and transmitted to the post-processing unit to be used for obtaining SOH parameters (functions of z) and an SOH indicator (a function of ž).

The second calculation unit 112 may obtain the differential capacity (dQ/dV) during constant current charging and differential voltage (dV/dQ) during constant voltage charging from the current and voltage measured at a specific sampling rate (S112 in FIG. 12). The dQ/dV and dV/dQ may also be obtained per z and may be stored in the database 200.

The post-processing unit 113 may obtain at least one SOH parameter based on the response functions obtained from the first calculation unit 111 and dQ/dV and dV/dQ from the second calculation unit 112 (S113 in FIG. 12).

At least one SOH parameter may correspond to the ratio of the response function's value to the initial value at each frequency, the standard deviation of these ratios at different frequencies, or the similarity of dQ/dV (and dV/dQ) curve between the present and previous charging.

SOH Parameters for Battery SOH Estimation

1) The ratio of the response function based on current fluctuations to its initial value: $\Phi_X(\omega, d, z)$ A type of SOH parameter $\Phi_X(\omega, d, z)$ may be defined as the ratio of the response function in the frequency domain based on the current fluctuation ($X'(\omega, d, z)$) to its initial value ($X'_{ini}(\omega, d, z)$), i.e., $\Phi_X(\omega, d, z)=X'(\omega, d, z)/X'_{ini}(\omega, d, z)$, at specific frequency $\omega$, SOC segment label d, and accumulated charge capacity z.

2) The ratio of the response function based on voltage fluctuations to its initial value: $\Phi_Y(\omega, d, z)$ A type of SOH parameter $\Phi_Y(\omega, d, z)$ may be defined as the ratio of the response function in the frequency domain based on the voltage fluctuation ($Y'(\omega, d, z)$) to its initial value ($Y'_{ini}(\omega, d, z)$), i.e., @y ($\omega, d, z$)=$Y'(\omega, d, z)/Y'_{ini}(\omega, d, z)$, at specific frequency $\omega$, SOC segment label d, and accumulated charge capacity z.

Figure 8:
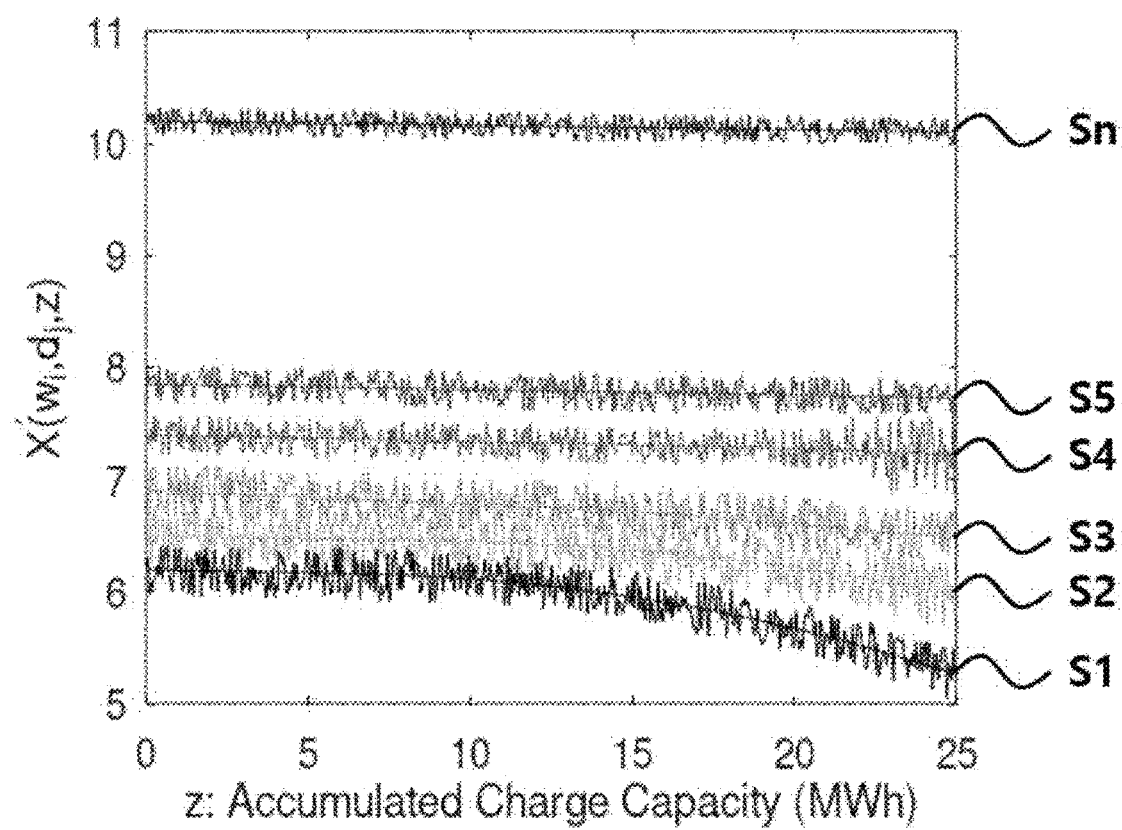
FIGS. 8 and 9 show graphs that explain parameters that can be obtained from the parameter processing module shown in FIG. 1 and FIG. 3.
Figure 9:
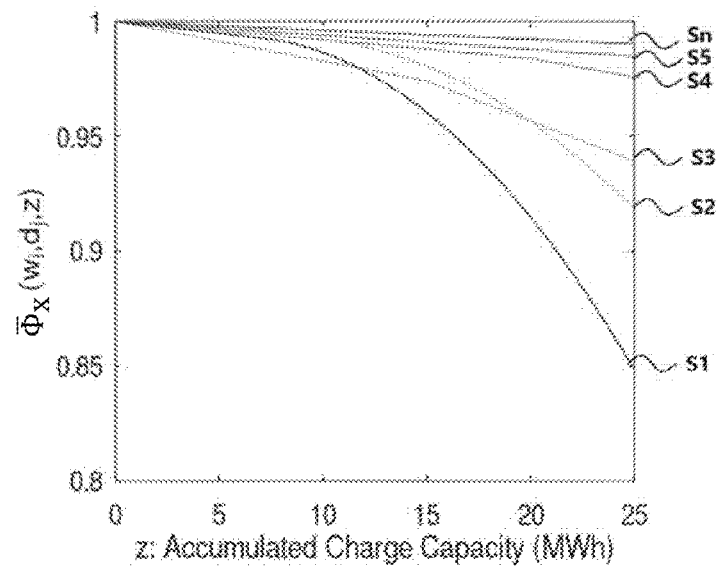
Figure 9:
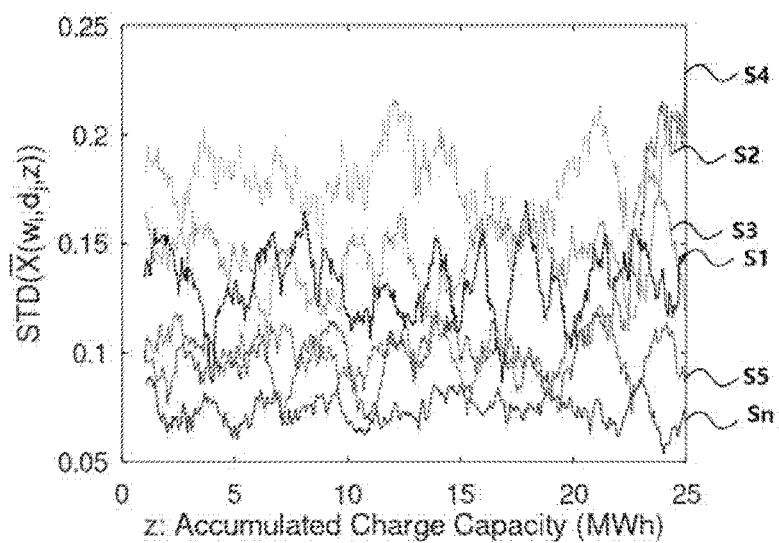

FIG. 8 shows several examples for $X'(\omega, d, z)$ with noise. The curves may be used after being smoothed out, with the noise removed. Panel (a) of FIG. 9 shows the normalized curves after the noise removal from the curves in FIG. 8, and panel (b) of FIG. 9 shows the standard deviation of each curve in FIG. 8 over a specific period of z.

More specifically, $\Phi_X(\omega, d, z)$ and $\Phi_Y(\omega, d, z)$ with noise as shown in FIG. 8 may be fitted to typical functions such as linear, polynomial, exponential, logarithmic functions, or combinations thereof, after the accumulated charging qualifies a minimum amount required for the fitting (e.g., corresponding to 5 full charges). The fitted results may be referred to as $\overline{\Phi}_X(\omega, d, z)$ and $\overline{\Phi}_Y(\omega, d, z)$ and may be used instead of $\Phi_X(\omega, d, z)$ and $\Phi_Y(\omega, d, z)$.

3) A standard deviation of the response function in the frequency domain based on current fluctuations: $\sigma_X(\omega, d, z)$ The response function in the frequency domain based on the current fluctuations ($X'(\omega, d, z)$) may be obtained and collected for a specific range of accumulated charge capacity ($z_{sd}$). The standard deviation of these collected $X'(\omega, d, z)$ may be defined as an SOH parameter $\sigma_X(\omega, d, z)=SD\{X'(\omega, d, z-z_{sd} \sim z)\}$.

4) A standard deviation of the response function in the frequency domain based on voltage fluctuations: Ty ($\omega, d, z$)

The response function in the frequency domain based on the voltage fluctuations ($Y'(\omega, d, z)$) may be obtained and collected for a specific range of accumulated charge capacity ($z_{sd}$). The standard deviation of those collected $Y'(\omega, d, z)$ may be defined as an SOH parameter $\sigma_Y(\omega, d, z)=SD\{Y'(\omega, d, z-z_{sd} \sim z)\}$.

When z is less than $z_{sd}$ for an SOC segment, $\sigma_X(\omega, d, z)$ and $\sigma_Y(\omega, d, z)$ may be defined as the standard deviations of $X'(\omega, d, z)$ and $Y'(\omega, d, z)$ collected for the entire z range of that SOC segment, respectively.

5) The similarity of dQ/dV curve between present and previous charging: $\mu_{dQ/dV}(\tilde{z})$
6) The similarity of dV/dQ curve between present and previous charging: $\mu_{dV/dQ}(\tilde{z})$ The similarities of dQ/dV and dV/dQ compared with those in the previous charging may be obtained by using Dynamic Time Warping Method.

That is, the similarities of dQ/dV and dV/dQ between two adjacent charging events may be used as SOH parameters, instead of the absolute values of dQ/dV and dV/dQ at a specific SOC. dQ/dV and dV/dQ curves for a specific SOC range may be used, instead of those for the entire SOC range.

The SOH estimation module 120 may use all or some of the SOH parameters to estimate the SOH based on their changes (S120).

SOH parameters multiplied by their weights may be summed to derive $\Theta(\tilde{z})$ using the following Eq. 2, and the SOH may be estimated based on the ratio of $\Theta(\tilde{z})$ to its value at the initial charging (Or) using the following Eq. 3.

$$\Theta(\tilde{z}) = \Sigma_{i,j} h_{ij} \Phi_X(\omega_i, d_j, z) + \Sigma_{k,l} h_{kl} \Phi_Y(\omega_k, d_l, z) + \Sigma_{p,q} h_{pq} \sigma_X(\omega_p, d_q, z) + \Sigma_{r,s} h_{rs} \sigma_Y(\omega_r, d_s, z) + h_v \mu_{dQ/dV}(\tilde{z}) + h_w \mu_{dV/dQ}(\tilde{z}) \quad \text{Eq. 2}$$

where $h_{ij}$, $h_{kl}$, $h_{pq}$, $h_{rs}$, $h_v$, and $h_w$ are the weights of the corresponding SOH parameters.

$$\Theta_r(\%) = \frac{\Theta(\tilde{z})}{\Theta(\tilde{z}_{INI})} \times 100 \quad \text{Eq. 3}$$

where $\Theta(\tilde{z})$ is the sum of the weighted SOH parameters, and $\Theta(\tilde{z}_{ini})$ is the SOH parameter at the initial charging. The initial charging may refer to the first effective charging.

The term 'effective charging' may refer to a charging session that exceeds approximately 30% of the nominal capacity of the battery. This value is selected tentatively to include data from charging in the constant current (CC) mode for at least 10% of the nominal capacity, as the charging process usually proceeds up to 80% SOC in the CC mode. When a different charging profile is used, a different value may be selected.

The SOH estimation module 120 may obtain the $\Theta_r$ using Eq. 3 and use it to estimate the SOH. The weights of SOH parameters may be obtained from the database.

The weights of SOH parameters may be adjusted based on reference data. The reference data are a collection of charging data (current and voltage measured during battery charging) under pre-defined charging conditions, or a more extended collection of the charging data from multiple batteries of the same battery model. Whenever new charging data are obtained from existing batteries or new batteries, they may be added to the reference data.

Once the weights of the SOH parameters have been adjusted, they may be stored in the database and used by the SOH estimation module for SOH estimation. The SOH estimation module may apply the adjusted weights to the corresponding SOH parameters using Eq. 2 and Eq. 3 to obtain Or. Thus obtained $\Theta_r$ may then be used to estimate the SOH directly or relatively. As more data are added to the reference data, the weights of SOH parameters may need to be adjusted continuously. Thus, it may be effective to include a separate monitoring system dedicated to tracking changes in the reference data and updating the weights of the SOH parameters on a regular basis. This process may continue until the reference data reach a sufficient level of diversity.

The methods for adjusting the weights of SOH parameters and estimating SOH directly and relatively will be explained in more detail referring to the embodiment shown in FIG. 10.

Figure 10:
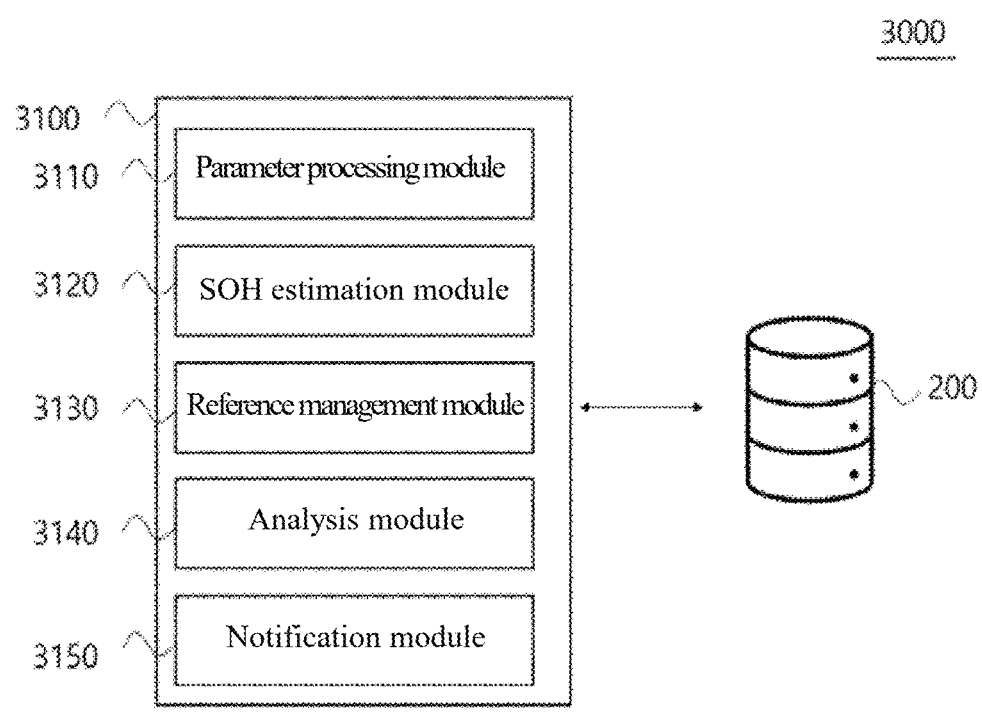
FIG. 10 is a block diagram that shows another embodiment of the system.
Figure 13:
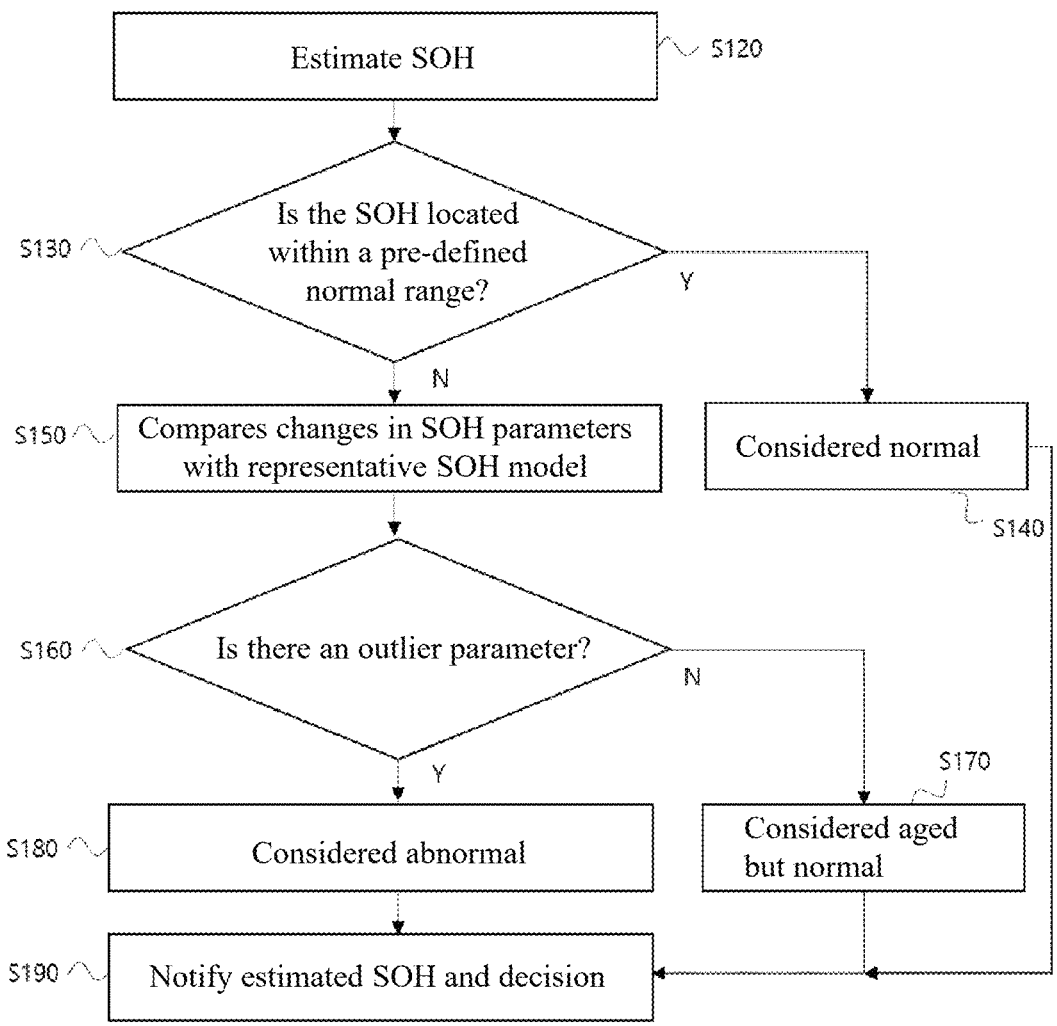
FIG. 13 is a flow diagram that shows the procedure for SOH estimation according to the embodiment shown in FIG. 10.

FIG. 10 shows another embodiment of the system, which includes a reference management module 3130, an analysis module 3140, and a notification module 3150, in addition to the components of the embodiments shown in FIG. 2 and FIG. 3. A parameter processing module 3110 and an SOH estimation module 3120 may have substantially the same functions as the parameter processing module 110 in FIG. 2 and the parameter processing system 2110 in FIG. 3, respectively. The SOH estimation module 3120 may perform additional functions that may be required to estimate the SOH either directly or relatively. The SOH estimation system in FIG. 10 can be explained along with the SOH estimation method in FIG. 13.

The parameter processing module 3110 may obtain SOH parameters, and the SOH estimation module 3120 may obtain the $\Theta_r$ using Eq. 3 and may use it to estimate the SOH directly and relatively. The weights of SOH parameters may be adjusted and managed by the reference management module 3130.

Estimating SOH Directly

In the present disclosure, estimating the SOH directly may mean that the value of Or itself serves as the SOH.

To estimate the SOH of an EV battery, SOH parameters may be obtained based on the charging data collected during the battery charging. The SOH estimation module 3120 may then read the weights of the SOH parameters for the same EV battery model from the database 200 and may apply them to the SOH parameters using Eq. 2. Here, the weights of the SOH parameters may have been adjusted based on reference SOHs, which have been collected as a part of the reference data.

As previously explained, the reference data may be collected by repeatedly charging one or more sample batteries within a specific SOC range using various charging conditions but within a safe range.

At the end of each charging session, a reference SOH may be defined as the ratio of the charging capacity within the specific SOC range to the initial value. This definition of reference SOH is based on a widely accepted industry standard for tracking capacity change. Other SOH definitions, such as internal resistance change, peak voltage shift, etc., may be considered in other embodiments. SOH parameters may also be obtained using the charging data, and their weights may be obtained by adjusting them to minimize the discrepancy between the $\Theta_r$ and the reference SOH. The adjusted weights may be stored in the database to be used by the SOH estimation module.

The reference data may be expanded up to 200-300 charging sessions or until problematic cases are detected. The number of charging sessions may vary depending on battery models.

The reliability of the reference data may be improved by increasing the number of sample batteries. It may also shorten the time needed to detect problematic cases.

Estimating SOH Relatively

The SOH estimation module 3120 may obtain the SOH in a relative manner. Reference data may be collected from batteries operated under various conditions including ideal and harsh conditions. The $\Theta_r$ in Eq. 3 may be obtained for each operating condition and used as the reference $\Theta_r$s. The SOH of an EV battery may then be estimated by comparing its $\Theta_r$ with the reference $\Theta_r$s.

Specifically, the weights of SOH parameters may be adjusted to allow $\Theta_r$s for the best and the worst cases to become 100% and 0%, respectively, and $\Theta_r$s for intermediate cases to be between 0% and 100%. Once adjusted, the weights may be applied to the corresponding SOH parameters of the EV battery using Eq. 2, to estimate its SOH. Since the reliability of this approach largely depends on the diversity of batteries included in the reference data, battery operating conditions may be arranged so that they can well-reflect various conditions that batteries can experience. A group of batteries may be operated under ideal conditions, such as slow charging within a safe SOC range with a nominal buffer, sufficient rest time between charging and subsequent discharging, operation at a constant and slow rate, and room temperature, etc., to maintain the batteries' original state longer. On the other hand, other group of batteries may be operated under harsh conditions, such as steep changes in charging and discharging rates, operating in extreme temperatures, frequent fast charging, full or overcharging and -discharging, etc., to degrade the batteries rapidly.

Reasoning behind the relative SOH estimation is that batteries operated under ideal conditions may age mildly and experience less degradation, while batteries operated under harsh conditions may degrade rapidly, resulting in a poorer SOH. As more diverse data from batteries of the same model are added, the reliability of SOH estimation may be improved.

The database 200 may store the SOH parameters and the obtained SOH as a function of accumulated charge capacity, for each battery model.

The reference management module 3130 may examine the developed SOH models of batteries for anomalies, and if any anomalies exist, those models may be excluded from further process. The remaining models may be weighted and averaged to create a representative SOH model. The weights of SOH parameters may be continuously updated as the reference data set grows, and as a result, the representative SOH model may also be updated over time.

The analysis module 3140 may compare the SOH of a battery to the distribution of SOHs for the same battery model with a similar value of z, to determine if the SOH falls within a pre-defined normal range. More specifically, in response to the SOH being within a pre-defined normal range (S130: Y) compared to the average SOH for the same type of EV battery model (the representative SOH), the battery may be determined to be normal (S140). In response to the SOH being outside of the pre-defined normal range (S130: N), the battery may then be subjected to additional analysis to determine its state and potential issues.

Specifically, the values of the SOH parameters may be compared with those used in the representative model. In response to the changes in the SOH parameters with respect to the accumulated charge capacity being consistent with the behavior of the representative SOH model, the battery may be determined to have been aged but still operating normal (S170). However, when one or more parameters behave significantly differently from the representative SOH model, the parameters may be examined for inconsistency with the reference model.

An outlier may be defined as a parameter deviation from the representative SOH model, expressed as a ratio (e.g., +20%) of the parameter in the representative SOH model. This ratio may vary depending on the battery model.

In other words, the analysis module 3140 may compare (S150) the changes in the SOH parameters with the SOH parameters of the representative SOH model. If there is an outlier parameter (S160: Y), the battery may be determined to be abnormal (S180). If there is no outlier parameter, the battery may be considered aged but normal (S170).

In some embodiments, in response to outlier parameters being consistently detected over a few charging sessions, the system may send an alert to user's smartphone 30.

Figure 11:
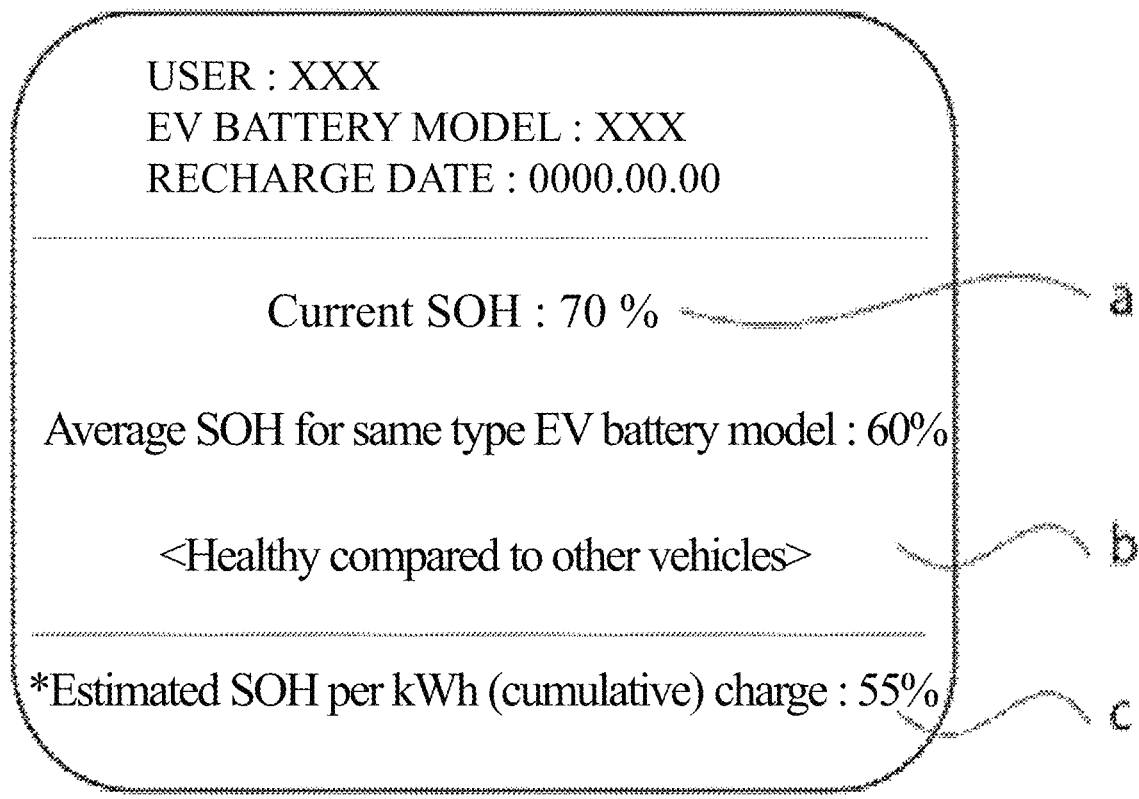
FIG. 11 is an example of the notification module in FIG. 10.

The notification module 3150 may provide the SOH estimated by the SOH estimation module 3120 and the decision made by the analysis module 3140 by sending a 'push' message (S190). For example, as shown in FIG. 11, users may receive the SOH (a) and the analysis result (b) on their smartphones 30.

The SOH estimation module 120 and 3120 may predict a battery's future SOH based on the past SOH estimates. Specifically, the changes in the SOH parameters with respect to the accumulated charge capacity may be tracked, and their tendency may be formulated as a typical function such a polynomial function, an exponential function, or the like. Then, the values of the SOH parameters at a specific future point in time and the resultant SOH may be predicted. The notification module 3150 may then provide the predicted information to the users for planning battery replacement.

The future point in time may be indicated by the users or administrators (e.g., managers or operators, which may be persons or machines) in terms of the additional accumulated charge capacity beyond the present. Thus, it should be greater than the accumulated charge capacity at present.

All of the data and results, including the current and voltage data, response functions, dQ/dV, dV/dQ, SOH parameters, estimated SOH, and analysis result, may be stored in the database 200 and may also be provided to system administrator's terminal as numerical values and/or figures.

Embodiments of the present disclosure have been described in more detail with reference to the accompanying drawings, but the present disclosure is not necessarily limited to these embodiments and may be practiced in various modifications without departing from the technical ideas of the present disclosure. Accordingly, the embodiments disclosed herein are intended to only illustrate and not to limit the technical ideas of the disclosure, nor the scope of the technical ideas of the disclosure. Therefore, the embodiments described above should be understood to be exemplary and non-limiting in any respect. The scope of protection of the present disclosure shall be construed in accordance with the following claims, and all technical ideas within the scope thereof shall be construed to be included in the scope of the present disclosure.

What is claimed is:

1. A system for measuring a state of health (SOH) of batteries, comprising:
   a database that receives and stores current data or voltage data, wherein at least a portion of the current data and the voltage data has been measured at a predetermined sampling rate in a non-equilibrium steady state during battery charging;
   a parameter processing module that obtains a frequency-domain response function based on Generalized Fluctuation-Dissipation Theorem (GFDT) using current fluctuation data or voltage fluctuation data for the non-equilibrium steady state and obtains at least one parameter associated with the SOH of a battery based on the obtained response function;
   an SOH calculation module that obtains the SOH of the battery based on said at least one parameter.

2. The system of claim 1, wherein the parameter processing module comprises:

a fluctuation part that comprises a first mode, in which a current fluctuation $\Delta I(t)$ with respect to a nominal current ($I_0(t)$) is calculated during a constant-current charging, and a second mode, in which a voltage fluctuation $\Delta V(t)$ with respect to a nominal voltage ($V_0(t)$) is calculated during a constant-voltage charging;

au autocorrelation function part that obtains autocorrelation functions $C_I(t)$ and $C_V(t)$ for the current fluctuation $\Delta I(t)$ and the voltage fluctuation $\Delta V(t)$, respectively; and a response function part that obtains time-domain response functions $X(t)$ and $Y(t)$ using the following equations and their frequency-domain response functions $X'(\omega)$ and $Y'(\omega)$ through a Fourier transform:

$$X(t) = \begin{cases} C_I(t)/(k_B T), & t \geq 0 \\ 0, & t < 0 \end{cases}$$

$$Y(t) = \begin{cases} C_V(t)/(k_B T), & t \geq 0 \\ 0, & t < 0 \end{cases},$$

wherein $X(t)$ is the time-domain response function for the current fluctuation $\Delta I(t)$, $Y(t)$ is the time-domain response function for the voltage fluctuation $\Delta V(t)$, and $k_B$ is the Boltzmann constant, and T is a temperature inside the battery.

3. The system of claim 1, wherein the autocorrelation function part divides data series of the current fluctuation $\Delta I(t)$ or the voltage fluctuation $\Delta V(t)$ for a corresponding SOC segment by a predetermined time step; obtains the autocorrelation function for each divided data series; and assigns an average of the autocorrelation functions as the autocorrelation function for the corresponding SOC segment.

4. The system of claim 1, wherein the autocorrelation function part divides data series of the currently fluctuation $\Delta I(t)$ or the voltage fluctuation $\Delta V(t)$ for a corresponding SOC segment by a predetermined time step dt; sub-divide each time step dt into a predetermined number of sub-steps; extract and divide the current data or the voltage data included in the sub-steps that correspond to each time step into a plurality of groups; obtains the autocorrelation function for each of the plurality of groups; and takes an average of the autocorrelation function across all of the plurality of groups to evaluate the autocorrelation function for the corresponding SOC segment.

5. The system of claim 2, wherein the frequency-domain response functions obtained by the response function part correspond to $X'(\omega, d, z)$ and $Y'(\omega, d, z)$, where $\omega$ is a frequency, d is an SOC segment index, and z is an accumulated charge capacity that has been accumulated to said d.

6. The system of claim 1, wherein the SOH calculation module obtains the SOH of the battery based on changes in said at least one parameter with respect to an accumulated charge capacity.

7. The system of claim 1, wherein the parameter processing module obtains parameters using ratios of the frequency-domain response functions to initial values thereof upon completion of the charging.

8. The system of claim 6, wherein the SOH calculation module applies a predetermined weight to said at least one parameter obtained during a corresponding charge cycle, sums weighted parameters, and uses a ratio of the sum to an initial value of a sum for an initial charge cycle to obtain the SOH of the battery for the corresponding charge cycle.

9. The system of claim 8, wherein the database stores weights that have been adjusted based on reference SOHs for an EV battery model, wherein the reference SOHs are obtained by repeatedly charging the battery of a same battery model within a pre-specified SOC range for a predetermined number of times and by calculating a ratio of a charged amount during the charging to a charged amount during an initial charging, and wherein the weights for SOH parameters are adjusted to allow the sum of weighted SOH parameters to be matched to the reference SOH.

10. The system of claim 8, wherein the database classifies and stores said at least one parameter, which has been obtained during charging of a plurality of EV batteries, by battery models, wherein the system further comprises a reference management module that calculates an average of each parameter for parameters stored for each battery model, obtains a representative SOH for each battery model using calculated averaged parameters, and wherein the representative SOH corresponds to a sum of the averaged parameters used in obtaining the representative SOH.

11. The system of claim 10, wherein the database classifies obtained SOHs, which have been obtained during charging of a plurality of EV batteries, by battery models, and wherein the system further comprises an analysis module that compares the SOH of the battery for which charging has been completed with an SOH distribution of a corresponding battery model and determines a status of the battery.

12. The system of claim 11, wherein, in response to the SOH of the EV battery for which charging has been completed being included within a predetermined range around an average SOH of the corresponding battery model, the analysis module determines the battery to be in a normal status.

13. The system of claim 11, wherein, in response to the SOH of the EV battery for which charging has been completed being located outside of a predetermined range around an average SOH of the corresponding battery model, the analysis module compares parameter distributions of the EV battery for which charging has been completed with parameter distributions of the corresponding battery model, and wherein the battery is determined to be in an abnormal status in response to presence of a parameter that differs by a reference value or greater.

14. The system of claim 11, wherein the SOH calculation module stores the obtained SOHs in an accumulated manner and predicts the SOH at a specific accumulated charge capacity based on the accumulated SOHs, and wherein the system further comprises a notification module that notifies a user of the SOH of the EV battery obtained by the SOH calculation module, and the analysis result obtained by the analysis module, and the predicted SOH.

* * * * *